United States Patent
Goossen

[11] Patent Number: 5,975,408
[45] Date of Patent: Nov. 2, 1999

[54] SOLDER BONDING OF ELECTRICAL COMPONENTS

[75] Inventor: Keith-Wayne Goossen, Aberdeen, N.J.

[73] Assignee: Lucent Technologies Inc., Murray Hill, N.J.

[21] Appl. No.: 08/956,527

[22] Filed: Oct. 23, 1997

[51] Int. Cl.[6] .................................................. B23K 31/02
[52] U.S. Cl. ................................ 228/173.2; 228/180.22; 29/840; 29/841
[58] Field of Search .......................... 228/180.22, 173.2, 228/174; 29/840, 841

[56] References Cited

U.S. PATENT DOCUMENTS

| | | | |
|---|---|---|---|
| 5,477,933 | 12/1995 | Nguyen | 228/180.22 |
| 5,704,116 | 1/1998 | Gamota et al. | 228/180.22 |
| 5,819,406 | 10/1998 | Yoshizawa et al. | 228/180.22 |

OTHER PUBLICATIONS

"Encapsulated Solder Joint for Chip Mounting," *IBM Tech. Discl. Bull.*, vol. 32, No. 10B, Mar. 1990, p. 480.

*Primary Examiner*—Patrick Ryan
*Assistant Examiner*—Jeffrey T. Knapp

[57] ABSTRACT

The specification describes a technique for solder bump bonding IC chips or chip packages to interconnection substrates. Epoxy prepolymer underfill is applied to the surface of the interconnection substrate prior to the solder bump bonding step. The presence of the prepolymer underfill material does not interfere with effective bonding. This technique reduces substantially the potential for voids in the underfill layer that tend to occur when the underfill is applied to a bonded IC chip/substrate assembly. It also enables curing of the underfill polymer in the same heating step used to effect thermocompression bonding of the solder bumps.

13 Claims, 2 Drawing Sheets

SOLDER BONDING OF ELECTRICAL COMPONENTS

FIELD OF THE INVENTION

This invention relates to methods for bonding electronic components to interconnection substrates.

BACKGROUND OF THE INVENTION

Solder bonding of packaged electronic chips to interconnection substrates is prevalent in the electronics industry. The most widely used forms of solder bonds are ball or bump bonds typically in a flip-chip assembly operation. The solder bonds form as pillars or beams that offset the joined surfaces with respect to one another leaving a gap therebetween. After the chip package is bonded to an interconnection substrate the resulting assembly typically undergoes further thermal cycling during additional assembly operations. The final assembly also is exposed to wide temperature changes in the service environment. The chip package is typically plastic, the interconnection substrate may be epoxy, ceramic or silicon. Both the material of the chip package, or the material of an intermediate interconnection substrate in the case where the solder bond interconnects interconnection substrates, frequently have thermal expansion coefficients that are different from one another, and are also different from the thermal expansion coefficient of solder. The differential expansion that the assembly invariably undergoes results in stresses on the solder bonds which can cause stress cracking and ultimately failure of the electrical path through the solder bond. To avoid solder bond failures due to mechanical stress, the gap between the surfaces joined by the bond is typically filled with an underfill material. The underfill provides additional bonding for the assembly and also protects the gap from moisture and other corrosive contamination. Underfill materials are adhesive and water insoluble. They are typically epoxy materials.

The underfill is applied after completion of the solder bonding operation. The underfill material is typically a polymer and is applied as a prepolymer liquid. Consequently, the viscosity of the underfill material as it is dispensed into the gap can be relatively low. The liquid prepolymer flows freely into the gap and, due to the relatively small gap in state of the art packages, flow is aided substantially by surface tension, and the liquid prepolymer is "wicked" into the gap. However, in some cases entrapped air, or incomplete wetting of the surfaces of the space being filled, inhibits flow or prevents wicking, causing voids in the underfill. Special problems arise with some package designs, e.g. microbumped packages, in which the solder bump pitch and the bump height is so small that the small gap resulting after the bonding operation cannot be filled consistently by relying only on fluid dynamics, and voids and bond failures are frequent.

STATEMENT OF THE INVENTION

I have developed an underfill technique for solder bonded assemblies that does not rely on wicking or fluid flow for filling the gap between the solder bonded surfaces. According to this technique a layer of underfill material is applied to one or both surfaces prior to solder bonding, and the solder bond is effected through the layer of underfill material. The underfill material is applied to a free and open surface thus allowing a variety of application techniques to be used which ensure complete coverage of the surfaces to be bonded.

The solder bonding operation in this technique is preferably a thermocompression bonding operation. It is found that the level of compression typically used in thermocompression bonding effectively squeezes the underfill prepolymer from the interface between the solder bumps and the mating contact pads, and the solder joint that results on heating is unaffected by the presence of the underfill layer.

DETAILED DESCRIPTION

Figure 1:
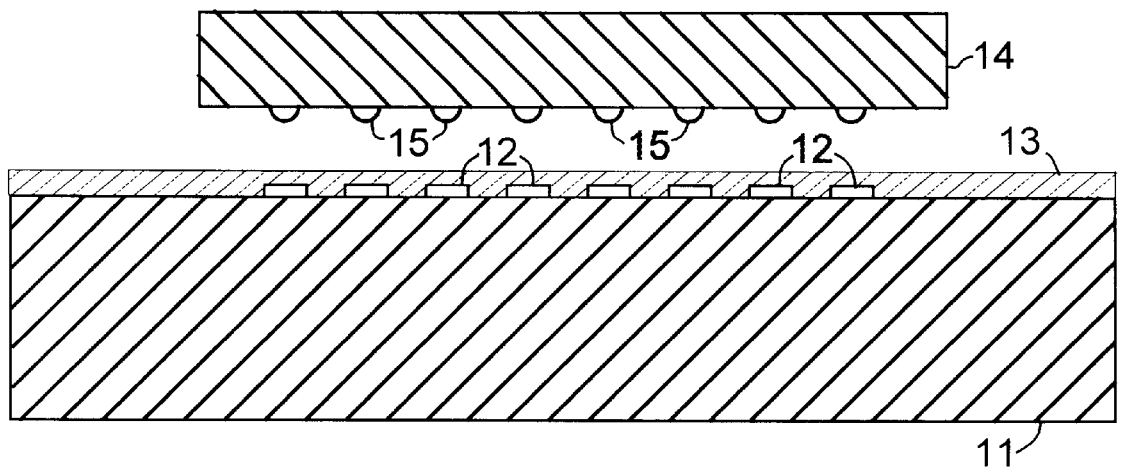
FIG. 1 is a schematic view of an interconnection substrate and a solder bumped flip chip prior to solder bonding according to the invention.

Referring to FIG. 1, an interconnection substrate 11 is shown with interconnect circuitry 12 printed on the interconnection substrate. The interconnection substrate 11 and printed interconnect circuit 12 are coated with a layer 13 of underfill material. The interconnection substrate may be a standard epoxy board, a ceramic substrate, or a silicon interconnection substrate. The substrate may be single or multilevel, and the circuit is formed by conventional means. Shown above the interconnection substrate is an IC package 14 to be solder bump bonded to the interconnection substrate. The package 14 has an array of solder bumps 15 on the underside of the chip package 14.

The term bump as used in this description is intended to mean solder bodies of whatever shape or description known and used in the art that join one surface to another leaving a gap between the joined surfaces. The packaged devices are typically semiconductor devices such as memory or logic chips, or photonic devices such as LEDs, lasers, modulators, detectors, etc.

For illustrating this invention the solder bump interconnections are shown between a chip package and an interconnection substrate. As is well known in the art, solder bump arrays, including both edge arrays and area arrays, are used for interconnecting elements in a variety of electronic or photonic assemblies. For example, a common arrangement is to bond one or more chip packages to an intermediate interconnection substrate, and to solder bump bond the intermediate interconnection substrate to a system interconnection substrate. While it is unnecessary to illustrate each known electronic package that uses solder bump bonding, it should be understood that this invention is applicable to any such package in which two essentially planar surfaces are joined mechanically and electrically by solder bumps. As used herein the term IC package is intended to include single chip packages, multiple chip packages, and multiple packages of single or multiple chips, i.e. multi-chip modules and combinations of multichip modules installed on an interconnection substrate.

The pitch of the contact pads in current technology is typically of the order of 50–200 $\mu$m and the spacing between pads may be 20–50 $\mu$m. The bumps are typically 10–30 $\mu$m in height (z-direction). The device package is usually square or rectangular with sides typically in the 2–50 mm range. The continuing trend is toward ever finer pitch packages, and so-called micro-bump arrays may have a pitch in the range 10–50 $\mu$m and bump height of 3–10 $\mu$m.

Figure 2:
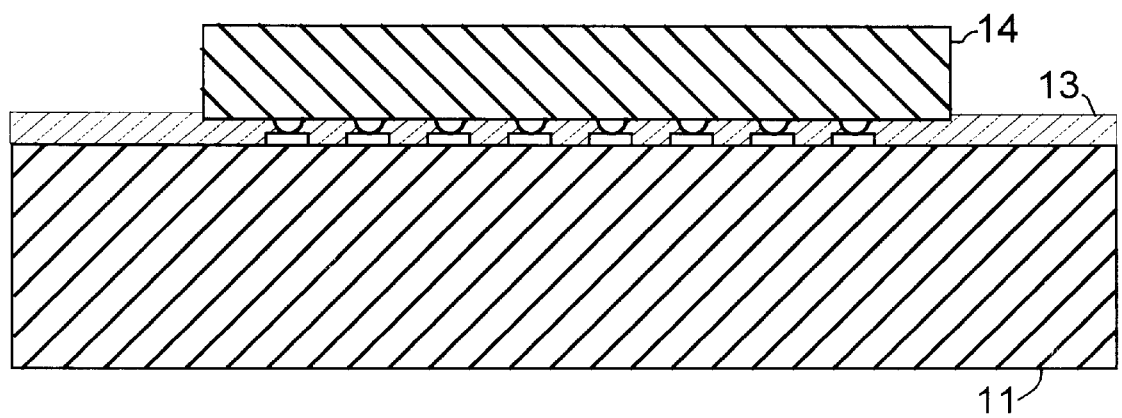
FIG. 2 is a schematic view similar to that of FIG. 1 showing the chip package and the substrate after solder bonding.

The IC package after solder bump bonding is shown in FIG. 2. It has been found that the presence of the underfill layer 13 during the solder bump bonding operation does not inhibit the formation of solder bonds that are both mechanically and electrically reliable.

Figure 3:
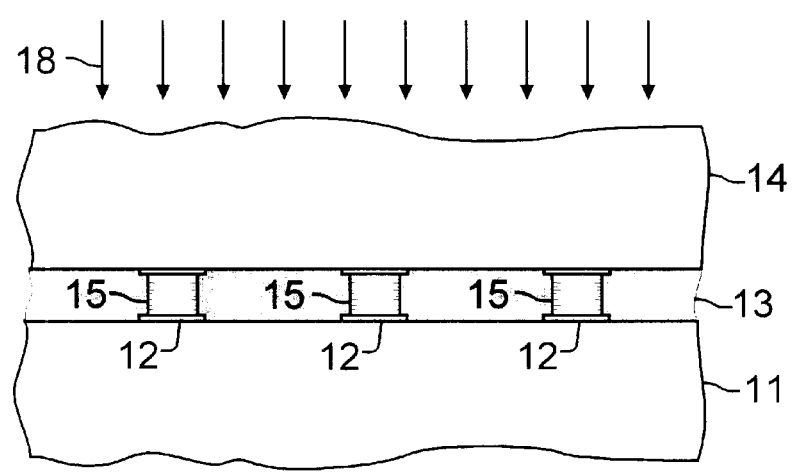
FIG. 3 is a schematic view showing in more detail the solder bonds made in FIG. 2.

The solder bump interconnections are shown in more detail in FIG. 3. The solder bumps after bonding form conductive pillars 15 that effectively bond to the contacts 12 on the interconnection substrate. As indicated above, the preferred technique for making the solder bonds is thermocompression bonding, illustrated schematically by arrows 18. The compression force is typically of the order of 1–10 mg/$\mu m^2$, and preferably between 2–5 mg/$\mu m^2$. This pressure is adequate to effectively squeeze the underfill material in layer 13 from the interface between the surfaces being bonded. The bonding temperature depends on the solder used, but is typically in the range 140–170° C. Conveniently, this temperature range also is effective for curing typical underfill materials. It is desirable therefore, to apply the compression prior to, or coincident with, heating the assembly, i.e. before substantial curing of the underfill occurs. Because the assembly can be bonded and the underfill cured in essentially a single heating operation, the conventional separate heating step for curing the underfill can be eliminated. Not only does this reduce processing time and cost, but it reduces the thermal cycling of the assembly, and thus reduces the potential for damage due to the thermal effects mentioned above.

In an alternative embodiment, curing of the underfill polymer is deliberately avoided during the thermocompression step to allow defective devices to be more easily dismounted for disposal or repair. In this case, the prepolymer can be chosen to require more severe curing conditions, i.e. either time or temperature or both, than the polymer would encounter during normal thermocompression bonding.

It will be appreciated that the viscosity of the underfill material when applied to the interconnection substrate prior to bonding is considerably less critical than when the wicking action described earlier is required for effective underfilling. Thus the underfill material can be applied at essentially any temperature that is convenient and provides effective coating of the substrate. It will also be evident that by reducing the demands on the properties of the underfill material a wider choice of materials is available. Typically the underfill material is a thermosetting polymer, e.g. an epoxy such as Model 931-A supplied by Able Stick. Application of the underfill prepolymer to the surface of the interconnection substrate is straightforward, and a variety of application techniques and applicator devices could be used. Because the application of the underfill is so convenient following the principles of the invention it may be effective to apply the underfill to the IC chip package instead of, or in addition to, applying it to the interconnection substrate. Coating both surfaces would further ensure complete wetting of the surfaces being bonded and complete filling of the gap therebetween.

Figure 4:
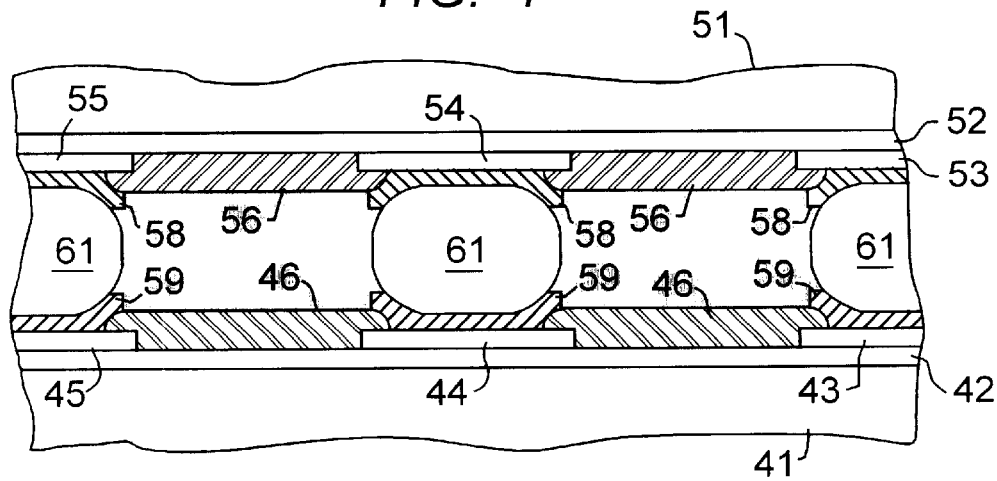
FIGS. 4–6 show additional features of the bonding operation.

Additional details of a typical solder bonding operation will be described in conjunction with FIGS. 4 and 5. Referring to FIG. 4, the substrate in this embodiment is a silicon wafer 41 covered with a layer 42 of $SiO_2$. Silicon is a preferred interconnection substrate material for packaged silicon chip devices because of its compatibility in both processing and in thermo-mechanical properties. Si interconnect substrates also provide these advantages for photonic device structures made in III–V semiconductor IC substrates.

The interconnection substrate 41 is shown as single level but can be a multilevel structure. The interconnection metallization pattern is covered with dielectric layer 46 except for the windows to contact regions 43–45. The dielectric layer 46 is typically polyimide but may be $SiO_2$ or other suitable dielectric. The device that is flip-chip bonded to substrate 41 is shown at 51, and is typically a semiconductor substrate covered with dielectric layer 52, usually $SiN_x$ caps or other suitable capping material. The details of the integrated circuit are not shown. Contact regions 53–55 are shown exposed by windows in dielectric layer 56. The dielectric layer 56 is deposited over the capping layer of the IC and is typically a polyimide, preferably photodefinable to form the windows for contacts 53–55.

The chip package 51 is adapted for flip chip bonding by applying under bump metallization (UBM) 59 in the contact windows as shown in FIG. 4. Similar UMB 59 may be applied to the contact windows on the substrate. The solder bumps 61 are deposited by e.g. evaporation and the thermocompression bond is made as described above. The underfill material, applied prior to solder bump bonding according to the invention, is designated 62 in the figure.

The metal or metals used for UBM can be chosen from a variety of materials with the requisite properties. The UBM must adhere well to the material of contact pads 43–45 and 53–55, must be wettable by typical tin solder formulations, and be highly conductive. A structure meeting these requirements is a composite of chromium and copper. Chromium is deposited first, to adhere to the contact pad, and copper is applied over the chromium to provide a solder wettable surface. Chromium is known to adhere well to a variety of materials, organic as well as inorganic. Accordingly it adheres well to dielectric materials, e.g. $SiO_2$, SINCAPS, polyimide, etc., commonly used in IC processing, as well as to metals such as copper and aluminum. However, solder alloys dissolve copper and de-wet from chromium. Therefore, a thin layer of copper directly on chromium will dissolve into the molten solder and then the solder will de-wet from the chromium layer. To insure interface integrity between the solder and the UBM, a composite or alloy layer of chromium and copper is typically used between the chromium and copper layers. Alternative composite layer UMB systems are Ti/Ni, Ti/Ni/Au, and Cr/Pt.

The composite layers in these UMB systems are conventionally sputtered, so several options for depositing them are conveniently available. The layer can be sputtered from an alloy target. It can be sputtered using a target of the first metal, then changing to a target of the second metal. Or it can be sputtered using separate targets in the same sputtering apparatus, and transitioning and is a preferred technique.

Figure 5:
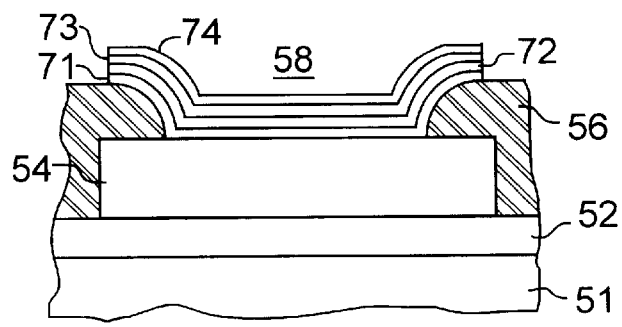

The multilayers for the UBM are deposited sequentially to form the composite layered structure shown in FIG. 5. (For simplicity, the detailed view of FIG. 5 shows a single contact site). In the typical Cr/Cu process, the layers are sputtered in a sputtering apparatus containing both a chromium target and a copper target. Sputtering techniques are well known and the details are not necessary for this description. Other techniques for depositing the metal layers, e.g. evaporation, can also be used.

The under bump metallization in FIG. 5 is shown generally at 58, formed in the contact window over contact 54. The silicon substrate is shown at 51 with dielectric layer 52. The UMB structure comprises a first layer 71 of chromium with a thickness of the order of 500–5000 Angstroms and preferably 1000–3000 Angstroms. Chromium adheres well to the contact 54, which may be Ti/Pd/Au or Al, and also adheres to the dielectric layers present in the structure. It also is refractory and forms a corrosion resistant interface with the aluminum contact. The second layer 72 is a thin transition layer of Cr/Cu to provide a solder wettable and a metallurgically sound interface between the chromium layer and the subsequently formed copper layer. Layer 72 is preferably formed by sputtering in an apparatus with both chromium and copper targets, and transitioning between the targets. This results in a co-sputtered layer with a composition varying between pure chromium and pure copper. The thickness of the transition layer is of the order of 1000–5000 Angstroms, and preferably 2000–3000 Angstroms.

The next layer 73 is a copper layer with a thickness of the order of 1000–10000 Angstroms, and preferably 2000–6000 Angstroms. The copper layer 73 is wettable with solder materials commonly used for the solder bumps. The melting point of most tin based eutectic solders is relatively low, and at the soldering temperature the surface of the copper layer reacts with the solder bump forming a physically and electrically sound intermetallic bond. Even if all the copper is consumed by the solder layer the solder will still adhere and wet the Cr/Cu composite layer. Tin still can react with Cu in the composite but Cr will not, so that the reacted Cu—Sn intermetallic component is locked into the Cr/Cu composite structure.

FIG. 5 shows an optional layer 74 of gold that may be applied to the surface of the copper layer to inhibit oxidation of the copper surface. The optional gold layer has a thickness of 500–3000 Angstroms, and preferably 1000–2000 Angstroms.

After completion of the multilayer UBM of FIG. 5, or an alternative contact metallization, the contact sites on the chip are coated with solder. The solder coating is formed by any suitable technique such as evaporation. The thickness of a typical solder bump for this application is 5–20 mils. Examples of solder compositions that can be used successfully in the processes described here are:

|    | I  | II | III |
|----|----|----|-----|
| Sn | 5  | 63 | 95  |
| Pb | 95 | 37 | 0   |
| Sb | 0  | 0  | 5   |

It should be evident that other solder materials can also be used in the technique described, such as In and In alloys, gold plated tin, etc.

Figure 6:
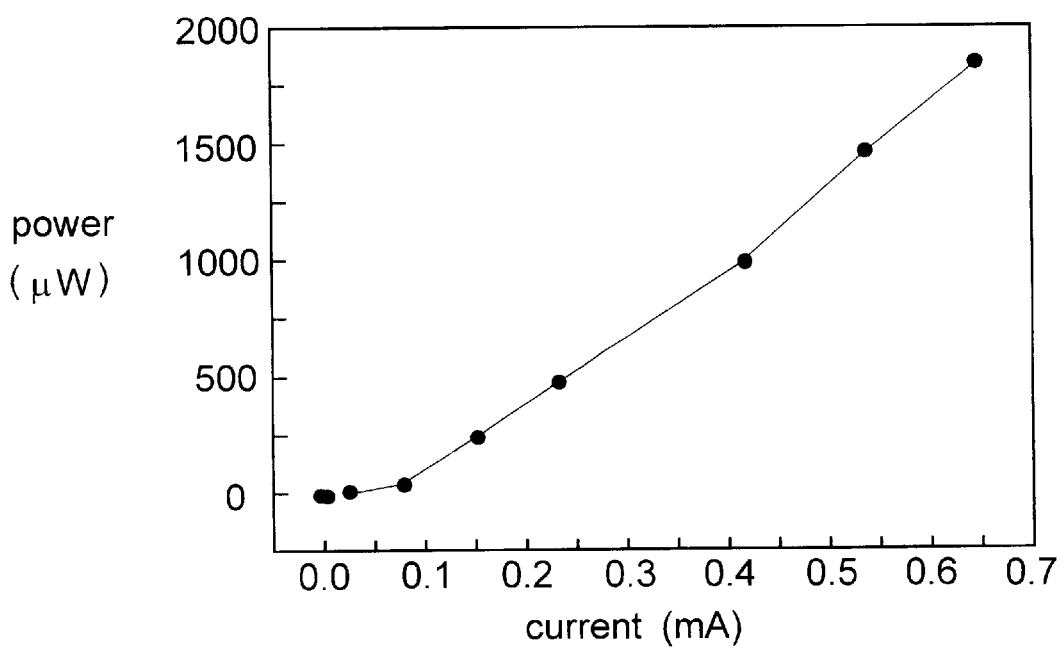

Experiments were conducted to verify that the application of the underfill prior to bonding does not affect the quality and electrical performance of the bond. Results are given in FIG. 6, which is a plot of current in mA vs. power in $\mu$W for an array of 512 LEDs flip chip bonded to a silicon interconnect substrate in the manner taught above. The bond pads were approximately 15×15 $\mu$m with approximately 15 $\mu$m spacing giving a pitch of 30 $\mu$m. The solder bumps were applied by evaporation of a solder layer approximately 4 $\mu$m thick and defined using standard photolithography and lift-off. The LED array was flip-chip bonded by aligning the chip, dispensing the epoxy underfill, and bonding the chip to the silicon substrate using a Model 8A Flip-Chip Bonder supplied by Research Devices Inc. The electrical optoelectric properties of the array after bonding were measured and the resulting power output curve of FIG. 6 is normal in all respects.

In the foregoing sequence of process steps, the solder bumps are described as being deposited on the packaged chip. Alternatively, the solder bumps can be deposited initially on the contact windows on the interconnection substrate. In some cases it may be desirable to form solder bumps on both of the surfaces to be joined.

While the technique of the invention preferably employs thermocompression bonding, equivalent results may be obtained using heat alone, as long as the contact surfaces to be joined are firmly placed together so that the solder bumps penetrate through the prepolymer layer. The surface dynamics at the interface will cause the solder to wet the contact surface and repel the underfill material.

In the normal practice of the invention described the underfill material will be a polymer and will be applied to the interconnection substrate as a prepolymer. The term prepolymer is intended to include both uncured and partially cured polymers.

Various additional modifications of this invention will occur to those skilled in the art. All deviations from the specific teachings of this specification that basically rely on the principles and their equivalents through which the art has been advanced are properly considered within the scope of the invention as described and claimed.

I claim:

1. A method for bonding an IC chip package to an interconnection substrate with an array of contact regions on the IC chip package electrically contacting and adhering to a mating array of contact regions on said interconnection substrate comprising the steps of:

a. depositing solder bumps on said array of contact regions on said IC chip package, b. applying a layer of a prepolymer of a polymer adhesive to the surface of said array of contact regions on said interconnection substrate, c. placing said IC chip package in contact with said layer of prepolymer on said interconnection substrate with said solder bumps aligned to said array of contacts regions on said interconnection substrate, d. applying pressure in the range 1–10 mg/mm$^2$ between said IC chip package and said interconnection substrate, said pressure being sufficient to cause said solder bumps to penetrate through said layer of prepolymer, and to cause a thermocompression bond between said solder bumps and said array of contact regions on said interconnection substrate, and e. heating said solder bumps to cause bonding between said solder bumps and said array of contact regions on said interconnection substrate.

2. The method of claim 1 in which steps d. and e. occur simultaneously.

3. The method of claim 1 in which the heating in step e. causes the said prepolymer to cure.

4. The method of claim 3 in which the solder bumps are heated to a temperature in the range 140–170° C.

5. A method for solder bonding a first surface to a second surface by applying to said first surface a plurality of solder bumps and bonding said plurality of solder bumps to said second surface thereby creating a gap between said first and second surfaces in between said solder bumps, and filling said gap with an underfill material, the invention characterized in that the underfill material is applied to at least one of said surfaces prior to the step of bonding said plurality of bumps to said second surface and the bonding step comprises applying pressure in the range 1–10 mg/$\mu$m$^2$ between said solder bumps and said second surface and heating said solder bumps to a temperature in the range 140–170° C. to cause bonding.

6. The method of claim 1 wherein the underfill material is applied to said second surface.

7. The method of claim 1 in which the first surface is the surface of a packaged semiconductor chip.

8. The method of claim 1 in which the underfill material is a prepolymer of an adhesive material.

9. The method of claim 8 in which the adhesive material is an epoxy.

10. The method of claim 8 wherein the bonding step includes the step of heating the solder bumps and the step of heating the solder bumps simultaneously causes curing of said prepolymer.

11. The method of claim 1 in which the second surface is the surface of an interconnection substrate.

12. The method of claim 11 in which the first surface is the surface of an interconnection substrate.

13. The method of claim 12 in which the interconnection substrate is selected from the group consisting of epoxy printed circuit boards, ceramic interconnection substrates and silicon interconnection substrates.

* * * * *

UNITED STATES PATENT AND TRADEMARK OFFICE
CERTIFICATE OF CORRECTION

| | |
|---|---|
| PATENT NO. | : 5,975,408 |
| APPLICATION NO. | : 08/956527 |
| DATED | : November 2, 1999 |
| INVENTOR(S) | : Keith-Wayne Goossen |

It is certified that error appears in the above-identified patent and that said Letters Patent is hereby corrected as shown below:

Column 6, Line 42: "applying pressure in the range 1-10 mg/mm$^2$"

should be replaced with

--applying pressure in the range 1-10 mg/$\mu$m$^2$--.

Signed and Sealed this

Ninth Day of January, 2007

JON W. DUDAS
*Director of the United States Patent and Trademark Office*